United States Patent
van Lammeren

(10) Patent No.: US 10,826,138 B2
(45) Date of Patent: *Nov. 3, 2020

(54) METHOD AND APPARATUS FOR CONTACT DETECTION IN BATTERY PACKS

(71) Applicant: Datang NXP Semiconductors Co., Ltd., Jiangsu (CN)

(72) Inventor: Joop van Lammeren, Jiangsu (CN)

(73) Assignee: Datang NXP Semiconductors Co., Ltd., Jiangsu (CN)

(*) Notice: Subject to any disclaimer, the term of this patent is extended or adjusted under 35 U.S.C. 154(b) by 457 days.

This patent is subject to a terminal disclaimer.

(21) Appl. No.: 14/565,574

(22) Filed: Dec. 10, 2014

(65) Prior Publication Data

US 2016/0172720 A1 Jun. 16, 2016

(51) Int. Cl.
*H01M 10/48* (2006.01)
*H01M 10/42* (2006.01)
(Continued)

(52) U.S. Cl.
CPC ........ *H01M 10/482* (2013.01); *G01R 31/382* (2019.01); *G01R 31/68* (2020.01);
(Continued)

(58) Field of Classification Search
None
See application file for complete search history.

(56) References Cited

U.S. PATENT DOCUMENTS 6,133,709 A 10/2000 Puchianu
2007/0285054 A1 12/2007 Li et al.
(Continued)

FOREIGN PATENT DOCUMENTS

EP 1967408 A2 9/2008
EP 2408053 A2 1/2012
(Continued)

OTHER PUBLICATIONS

European Search Report for EP Application No. 151992492-1568 dated May 23, 2016.
(Continued)

*Primary Examiner* — Barbara L Gilliam
*Assistant Examiner* — Helen M McDermott
(74) *Attorney, Agent, or Firm* — Harness, Dickey & Pierce, P.L.C.

(57) ABSTRACT

Method and apparatus for contact detection in battery packs are disclosed. The battery pack may comprise at least a first battery cell and a second battery cell, and a power bar for coupling a first electrode of the first battery cell to a second electrode of the second battery cell. The first battery cell comprises a supervisor, which comprises a transmitter/receiver for signal communication with the second battery cell via a communication wire, and a voltage difference detector coupled to the power bar and the communication wire, for detecting a voltage difference between the power bar and the communication wire. The supervisor may indicate degraded contact of the power bar if the detected voltage difference is out of a predetermined threshold range. A battery cell and a method for monitoring a battery pack are also disclosed.

19 Claims, 6 Drawing Sheets

(51) Int. Cl.
  *H01M 2/10* (2006.01)
  *H01M 2/20* (2006.01)
  *G01R 31/382* (2019.01)
  *G01R 31/68* (2020.01)

(52) U.S. Cl.
  CPC ......... *H01M 2/1016* (2013.01); *H01M 2/202* (2013.01); *H01M 10/425* (2013.01); *H01M 2010/4278* (2013.01)

(56) References Cited

U.S. PATENT DOCUMENTS

| | | |
|---|---|---|
| 2010/0259221 A1 | 10/2010 | Tabatowski-Bush |
| 2012/0249334 A1* | 10/2012 | Dao ................. H04Q 9/00 340/636.1 |
| 2012/0256598 A1 | 10/2012 | Hsu et al. |
| 2013/0021037 A1 | 1/2013 | Deveau et al. |
| 2013/0088237 A1 | 4/2013 | Kamata et al. |
| 2013/0245970 A1 | 9/2013 | Zhang |
| 2013/0337294 A1 | 12/2013 | Achhammer |
| 2014/0018990 A1 | 1/2014 | Kataoka et al. |
| 2014/0145685 A1* | 5/2014 | Bosch ................. H02J 7/0029 320/162 |
| 2014/0278174 A1 | 9/2014 | Biskup et al. |
| 2015/0221994 A1* | 8/2015 | Ziemian ........... H01M 10/4207 429/93 |

FOREIGN PATENT DOCUMENTS

| | | |
|---|---|---|
| EP | 2803109 A1 | 11/2014 |
| JP | 2010256155 A | 11/2010 |
| WO | WO-2013/104394 A1 | 7/2013 |

OTHER PUBLICATIONS

European Search Report for EP Application No. 151992575-1568 dated May 23, 2016.

U.S. Appl. No. 14/807,414, Publication No. 206-0169980, filed Jul. 23, 2015, Van Lammeren.

* cited by examiner

METHOD AND APPARATUS FOR CONTACT DETECTION IN BATTERY PACKS

FIELD OF THE INVENTION

This disclosure generally relates to battery packs, and more specifically to method and apparatus for supervision in battery packs.

BACKGROUND OF THE INVENTION

Battery packs formed with a number of series-connected battery cells are widely employed for power supply, especially in mobile appliances. As known, in (hybrid) electric vehicles, a battery pack is used to generate a high voltage to drive the motor. In such a battery pack, the number of battery cells are coupled in series by electrically conducting power bars, wherein each power bar can electrically couple a positive electrode of one battery cell to a negative electrode of an adjacent battery cell, e.g., by soldering or bolting.

Each component on a current path in the battery pack is preferably designed to have a small resistance in order to reduce useless power dissipation, especially when a current flowing through the battery cells is large (e.g., several 100 A). Usually, the contact resistance between the power bars and the battery electrodes may be taken into account. Moreover, this contact resistance will rise if the contact gets corroded, loose, aging, etc. If the pack current is high, even a contact resistance of just 1 m would be unacceptable. For example, with a pack current of 100 A, it would give rise to a power dissipation of 10 W, which is undesirable. Furthermore, a high contact resistance would lead to a hotspot that can severely limit the lifetime of the battery cell involved. In case of severe corrosion, the temperature rise may even cause a fire or explosion.

Accordingly, it is desirable for methods and systems for contact detection in battery packs.

SUMMARY OF THE INVENTION

Method and apparatus for contact detection in battery packs are disclosed.

In one embodiment, a battery pack is disclosed. The battery pack may comprise at least a first battery cell and a second battery cell, and a power bar for coupling a first electrode of the first battery cell to a second electrode of the second battery cell. The first battery cell may comprise a supervisor, which comprises: a transmitter/receiver for signal communication with the second battery cell via a communication wire; and a voltage difference detector coupled to the power bar and the communication wire, for detecting a voltage difference between the power bar and the communication wire. The supervisor may indicate degraded contact of the power bar if the detected voltage difference is out of a predetermined threshold range. In one aspect, the degraded contact comprises at least one of contact corrosion or loose-contact.

The voltage difference detector may be configured to detect the voltage difference when the transmitter/receiver is receiving signal communication via the communication wire. The signal communication via the communication wire may occur in a current domain or voltage domain, and the voltage difference detector may detect a DC voltage difference between the power bar and the communication wire.

In one aspect, the supervisor may further comprise a digital circuit coupled to the voltage difference detector, for analyzing the detected voltage difference. In one aspect, the battery pack may further comprise a pack controller for controlling operation of the battery pack, wherein the at least the first battery cell and the second battery cell communicate with the pack controller through a daisy chain of communication wires.

In one aspect, the voltage difference detector may comprise at least one of a comparator or an Analog-to-Digital Converter (ADC). Alternatively, the voltage difference detector may comprise an Analog-to-Digital Converter (ADC) which alternately detects a voltage across two electrodes of the first battery cell or the voltage difference between the power bar and the communication wire. Alternatively, the voltage difference detector may comprise a Schmitt trigger.

In one aspect, the supervisor may be integrated within the first battery cell, wherein the voltage difference detector is coupled to the first electrode of the first battery cell. Alternatively, the supervisor may be external to the first battery cell, wherein the voltage difference detector is coupled to the power bar. In one aspect, the supervisor may comprise a voltage difference detector coupled to each electrode of the first and/or second battery cell.

In another embodiment, a battery cell is also disclosed. The battery cell may comprise a power bar coupling to an electrode of the battery cell for power transmission; and a supervisor. The supervisor may comprises a transmitter/receiver for signal communication from/to the supervisor; and a voltage difference detector coupled to the power bar and the communication wire, for detecting a voltage difference between the power bar and the communication wire. The supervisor may indicate degraded contact of the power bar if the detected voltage difference is out of a predetermined threshold range.

In yet another embodiment, a method for monitoring a battery pack that comprises at least a first battery cell and a second battery cell coupled in series by a power bar is disclosed. The method may comprise: detecting a voltage difference between the power bar and a communication wire, wherein the communication wire is used for signal communication between the first battery cell and the second battery cell; and indicating degraded contact of the power bar if the detected voltage difference is out of a predetermined threshold range.

With this invention, the (onset of) degradation (e.g., corrosion or loosening) of a contact can be detected by the cell supervisor, without the need to add external components or wires to the battery pack. By simply monitoring the voltage difference between the power bar and the corresponding communication line, an increase of the contact resistance can be measured for each individual power bar in the battery pack. All required additional circuitry can be easily integrated into the cell supervisor. Such detection is beneficial to improve the performance of the battery pack, extend the battery lifetime between recharges, and avoid potential damage to the battery pack.

BRIEF DESCRIPTION OF THE DRAWINGS

Further features and advantages will become apparent from the following and more particular description of the preferred embodiments of the invention, as illustrated in the accompanying drawings, in which like referenced numerals generally refer to the same parts or elements throughout the drawings, and in which.

DETAILED DESCRIPTION OF THE INVENTION

Figure 1:
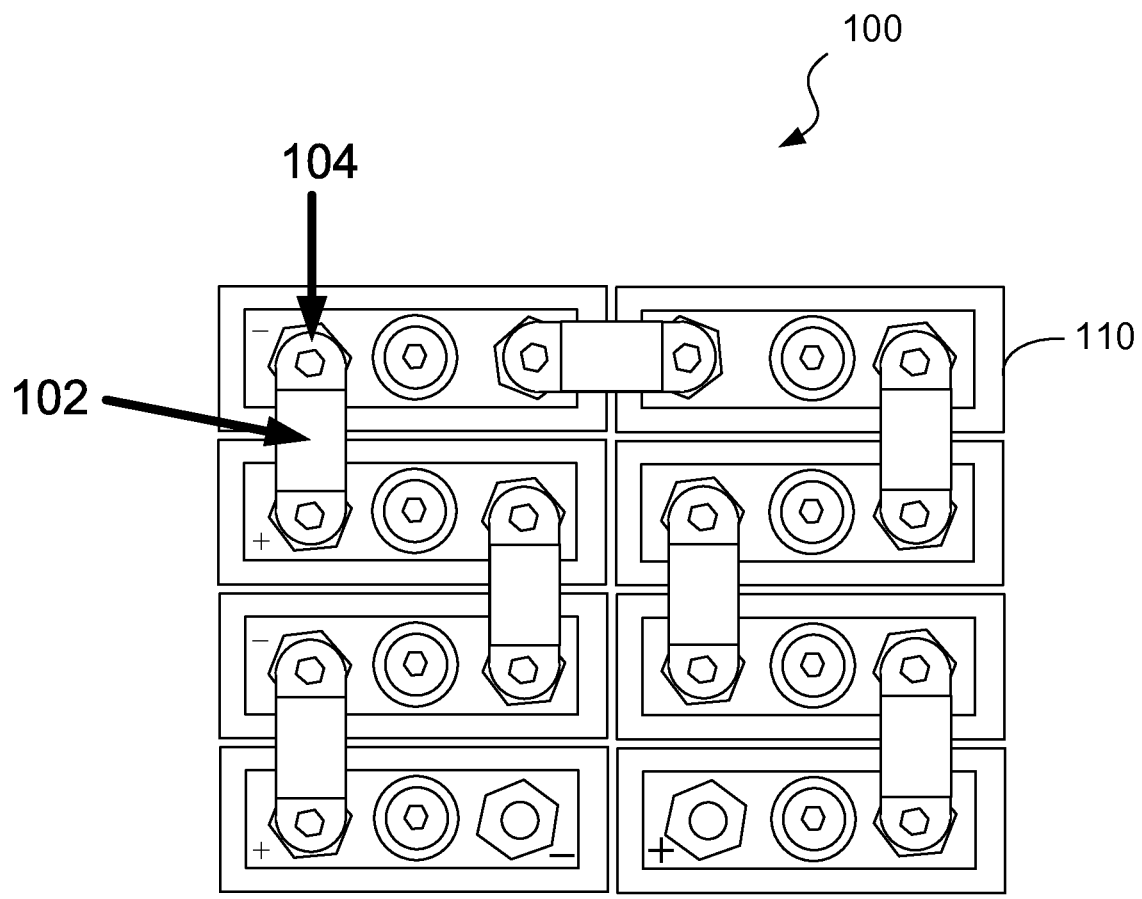
FIG. 1 is a top view of an exemplary battery pack, according to an embodiment of the invention.

The detailed description set forth below in connection with the accompany drawings is intended as a description of exemplary embodiments of the present invention and is not intended to represent the only exemplary embodiments in which the present invention can be practiced. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the exemplary embodiments presented herein.

The term "example" or "exemplary" as used throughout this application is only by way of illustration, and not limitation. Further, it will be understood that when an element is referred to as being "connected to" or "coupled to" another element, it can be directly connected or coupled to the other element or intervening elements may be present. For reference numerals with letter character designations such as "202a" or "202b", the letter character designations may differentiate two like parts or elements present in the same figure. Such letter character designations may be omitted when it is intended that a reference numeral to encompass all parts having the same reference numeral in all Figures.

FIG. 1 is a top view of an exemplary battery pack 100 composed of a plurality of battery cells 110. For clarity, the battery pack 100 is illustrated with 8 battery cells 110. However, it should be understood that, a battery pack according this invention can have more or less battery cells. The battery cells 110 are coupled in series by electrically conducting power bars 102, which connect a positive electrode of one battery cell to a negative electrode of an adjacent battery cell. Such power bars 102 can be electrically connected to the cell electrodes by soldered or bolted contacts 104, etc.

Figure 2:
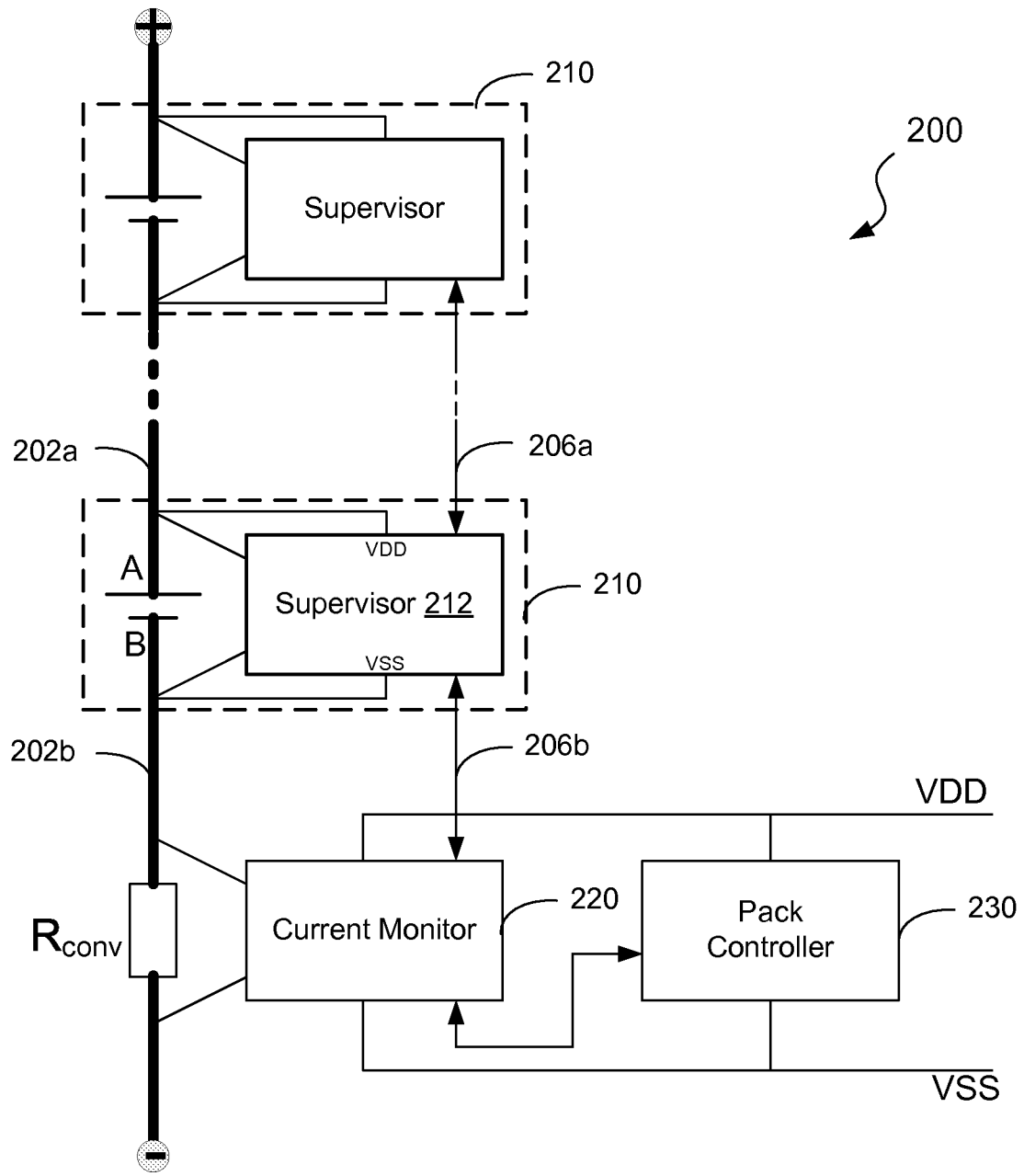
FIG. 2 schematically depicts a block diagram of a battery pack with integrated supervisors, according to an embodiment of the invention.

FIG. 2 schematically depicts a block diagram of a battery pack 200 with integrated supervisors 212, according to an embodiment of the invention. The battery pack 200 includes a plurality of battery cells 210 serially connected by power bars 202 (e.g., 202a, 202b). Each battery cell 210 has a positive electrode A and a negative electrode B. The individual ends of the power bars 202 may be electrically coupled to the respective cell electrodes by soldered or bolted contacts, or the like.

FIG. 2 also shows an optional conversion resistor, Rconv, connected in series with the battery cells 210. An optional current monitor 220 can detect a voltage drop across the resistor Rconv, which effectively reflects the pack current flowing through the serially-connected battery cells 210 and thus may be used for purpose of supervision. The battery pack 200 may further include a pack controller 230 to control the operation of the battery pack 200 based on detected measurements and/or input commands. The battery cells 210 (as well as the current monitor 220, if applicable) may communicate with the pack controller 230 through a daisy chain of communication wires 206. In particular, a signal intended to be communicated between any battery cell 210 and the pack controller 230 may pass through other battery cells 210 (or other components, if any) located therebetween.

According to an embodiment of this invention, one or more of the battery cells 210 may have an integrated supervisor 212 for at least contact detection for the battery cell 210. Such a supervisor 212 may be integrated within the battery cell 210. Alternatively, the supervisor 212 can be built into the battery pack 200 and external to the associated battery cell 210, preferably as close as possible to the battery cell being monitored.

According to an embodiment of this invention, the battery cell 210 supplies voltages VDD and VSS for the associated supervisor 212, where the DC level of the communication wire 206 can be set based on (e.g., equal to) the VDD of the transmitting supervisor 212. During a normal condition, the power bar 202 between each pair of battery cells 210 has the same (or substantially the same) potential as the connected cell electrodes, and thus can act as the signal ground (VSS) for the corresponding communication wire 206. The voltage difference between the power bar 202 and the corresponding communication line 206 is approximately equal to zero or (VDD−VSS), depending on which supervisor 212 is transmitting on the communication line 206.

However, if the contact between the power bar 202 and the cell electrode is degraded (e.g., corroded, loose, or otherwise compromised), a contact resistance between the power bar 202 and the cell electrode will increase and cause an increased voltage drop. Accordingly, the potential downstream in the current path from the degraded contact will decrease as compared to that in a normal situation, and the voltage difference between the power bar 202 and the corresponding communication line 206 will change. Therefore, it is possible for the supervisor 212 to perform contact supervision by monitoring a voltage difference between the power bar 202 and the corresponding communication line 206. In particular, the supervisor 212 associated with the battery cell 210 is configured to measure a voltage difference between the power bar 202 and the corresponding communication wire 206, and may compare the detected voltage difference to a threshold value, so as to ascertain whether a contact is compromised (e.g., corroded, loose, or the like), as further described in details below.

Figure 3A:
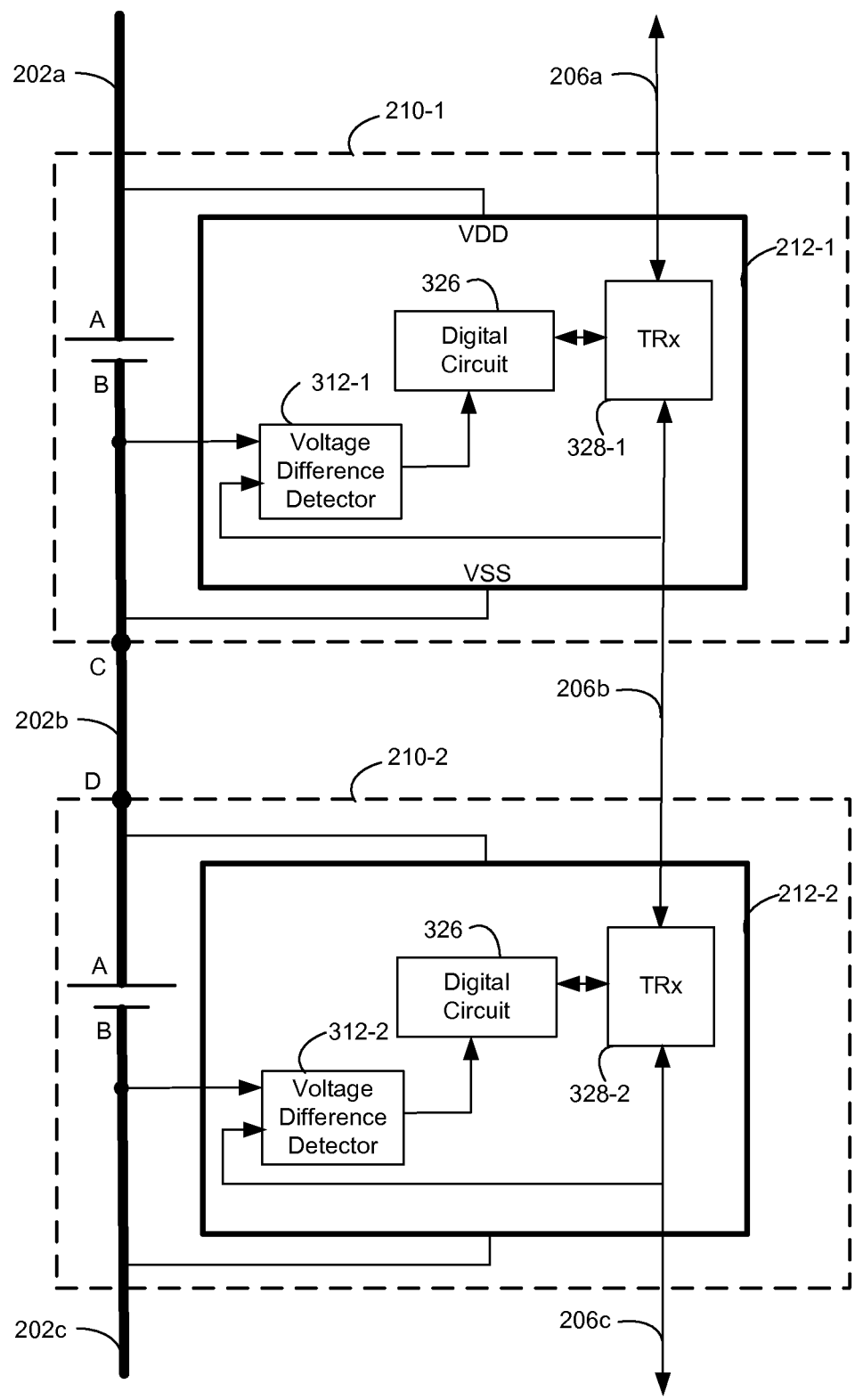
FIG. 3A is a block diagram of a battery pack with integrated supervisors, according to an embodiment of the invention.

FIG. 3A is a block diagram of a battery pack with integrated supervisors 212, according to a single-side supervision configuration in an embodiment of this invention. By way of illustration, two battery cells 210-1 and 210-2 in the battery pack are shown, and they are connected to each other with a power bar 202b at nodes C and D. The battery cells 210-1 and 210-2 have supervisors 212-1 and 212-2 integrated therein, respectively. Note that the segment BC or AD represents the electrode of the respective battery cell 210. Other battery cells in the battery pack can be configured similarly.

The supervisor 212 each can include a digital circuit 326 for performing analysis on detected measurements or controlling operation of the battery cell 210 based on the measurements and/or commands from the pack controller 230 (see FIG. 2). A transmitter/receiver (TRx) 328 may also be provided for signal communication via the communication wires 206. For example, the TRx 328 may receive information from the digital circuit 326 and communicate it to other battery cells 210 and/or to the pack controller 230 via the communication wires 206. Also, the TRx 328 may receive a signal from other battery cells 210 and/or the pack controller 230 via the communication wires 206 and communicate it to the digital circuit 326.

According to an embodiment of this invention, each of the supervisors 212 may include a voltage difference detector 312 on at least one electrode side of the associated battery cell 210, for measuring a voltage difference between the power bar 202 (e.g., 202a, 202b, 202c . . . ) and the corresponding communication wire 206 (e.g., 206a, 206b, 206c . . . ). As mentioned above, such voltage difference reflects a contact condition between the power bar 202 and the cell electrodes. As shown in FIG. 3A, the voltage difference detector 312 is coupled to the negative electrode of the associated battery cell 210.

The communication on the communication wire 206 can take place in the current domain or voltage domain. If the communication is in the current domain, the receiving side acts as virtual ground for the associated voltage difference detector 312, which is capable of performing a DC measurement between the power bar 202 and the communication line 206 directly. On the other hand, if the communication is in the voltage domain, the voltage difference measurement may take place when the transmitter's output is at ground potential. In addition, filtering or timing may be employed to separate a DC voltage difference between power bar and communication line from the communication signal on the communication line 206. Even no information needs to be communicated on the communication line 206, the digital circuit 326 may instruct the Trx 328 to transmit dummy signal on the communication line 206 based on scheduled timing, for purpose of voltage difference measurement. As each supervisor 212 (in particular, the digital circuit 326) knows what communication is ongoing on the communication line 206, the digital circuit 326 can control the voltage difference detector 312 to perform voltage difference measurement at appropriate times.

With the supervisor 212 being located within the battery cell 210, the battery cell 210 supplies voltages VDD and VSS for the supervisor 212 from the positive electrode A and negative electrode B, respectively. In a normal condition, the voltage difference detector 312-1 will detect a zero (or small) voltage difference between the power bar 202b and the communication wire 206b, when the TRx 328-1 receives signal communication on the communication wire 206b from the battery cell 210-2. Otherwise, if a contact C (or D) between the power bar 202b and the associated cell electrode is degraded and thus has an increased resistance, there will be an increased voltage drop on the degraded contact, causing the potential on the negative electrode B of the battery cell 210-1 to decrease. Consequently, the voltage difference detector 312-1 will detect a voltage difference change between the power bar 202b and the communication wire 206b, when the TRx 328-1 receives on the communication wire 206b. If the detected voltage difference (e.g., the absolute value there of) is out of a predetermined threshold range (e.g., exceeding a predetermined threshold), the voltage difference detector 312-1 may assert a signal to indicate degraded contact of the power bar 202b. For example, the voltage difference detector 312-1 may send an alert signal to the TRx 328-1, which in turn transmits the alert signal to the pack controller 230.

Similarly, the voltage difference detector 312-2 in the battery cell 210-2 may monitor the contact condition of the power bar 202c by measuring a voltage difference between the power bar 202c and the communication wire 206c, when the TRx 328-2 receives signal communication on the communication wire 206c. In the same way, it is possible to monitor all the contacts between the power bars 202 and the associated cell electrodes in the battery pack.

Figure 3B:
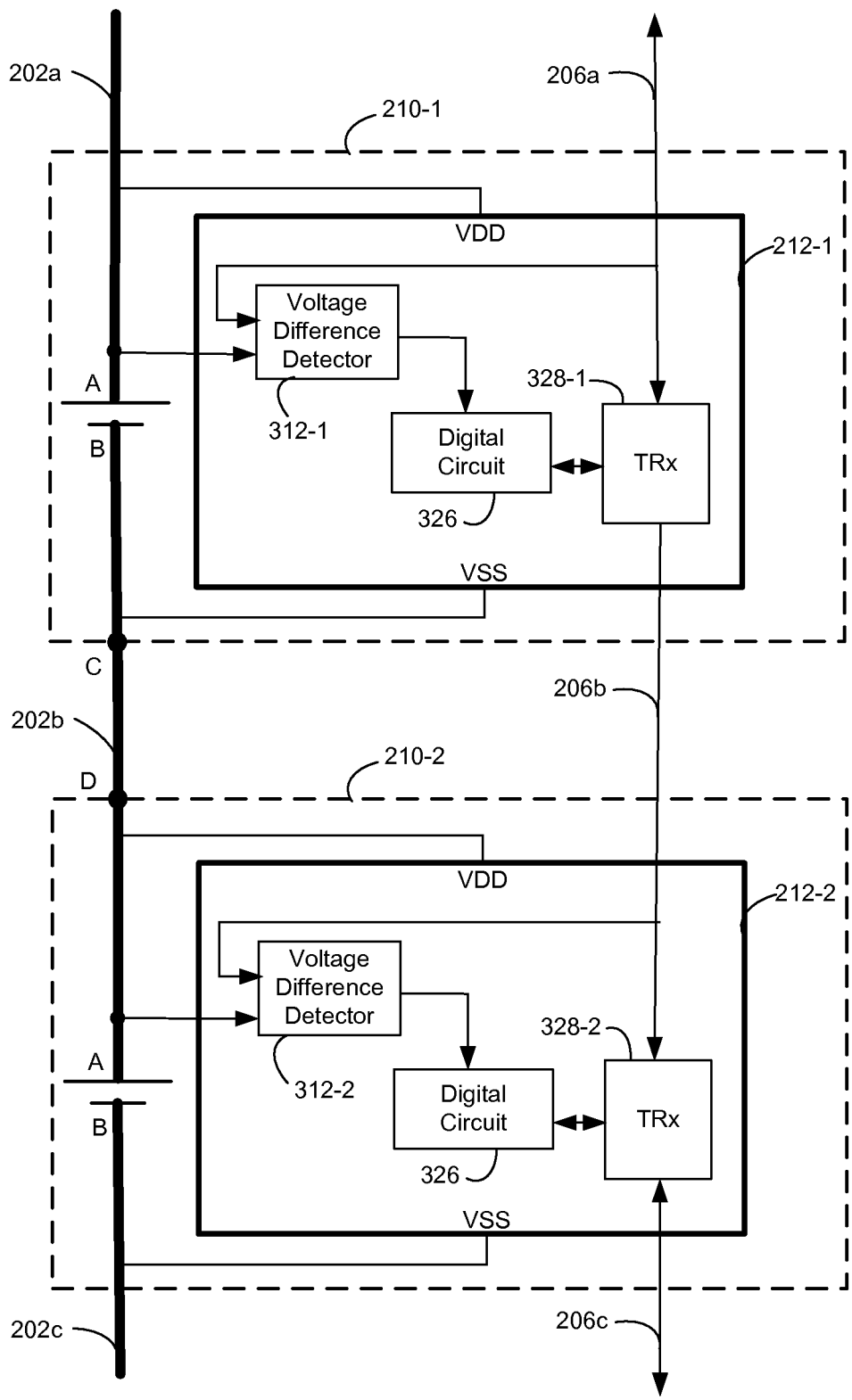
FIG. 3B is a block diagram of a battery pack with integrated supervisors, according to another embodiment of the invention.

Alternatively, the voltage difference detector 312 can be coupled to the positive electrode A of the associated battery cell 210, as shown in FIG. 3B. Normally, the voltage difference detector 312-2 in the battery cell 210-2 will detect a normal voltage difference between the power bar 202b and the communication wire 206b (e.g., VDD−VSS of the battery cell 210-1), when the TRx 328-2 receives signal communication on the communication wire 206b. Otherwise, if a contact C (or D) between the power bar 202b and the associated cell electrode is degraded and thus has an increased resistance, the potential on the positive electrode A of the battery cell 210-1 (VDD) will decrease. Consequently, the voltage difference detector 312-2 will detect a voltage difference change between the power bar 202b and the communication wire 206b. If the detected voltage difference is out of a predetermined threshold range (e.g., below a predetermined threshold), the voltage difference detector 312-2 may assert a signal to indicate degraded contact of the power bar 202b.

Similarly, the voltage difference detector 312-1 in the battery cell 210-1 may monitor the contact condition of the power bar 202a by measuring a voltage difference between the power bar 202a and the communication wires 206a. As above, with each supervisor 212 having a voltage difference detector 312 on either the positive electrode A or negative electrode B of the associated battery cell 210, it is possible to monitor all the contacts between the power bars 202 and the associated cell electrodes in the battery pack.

Figure 4:
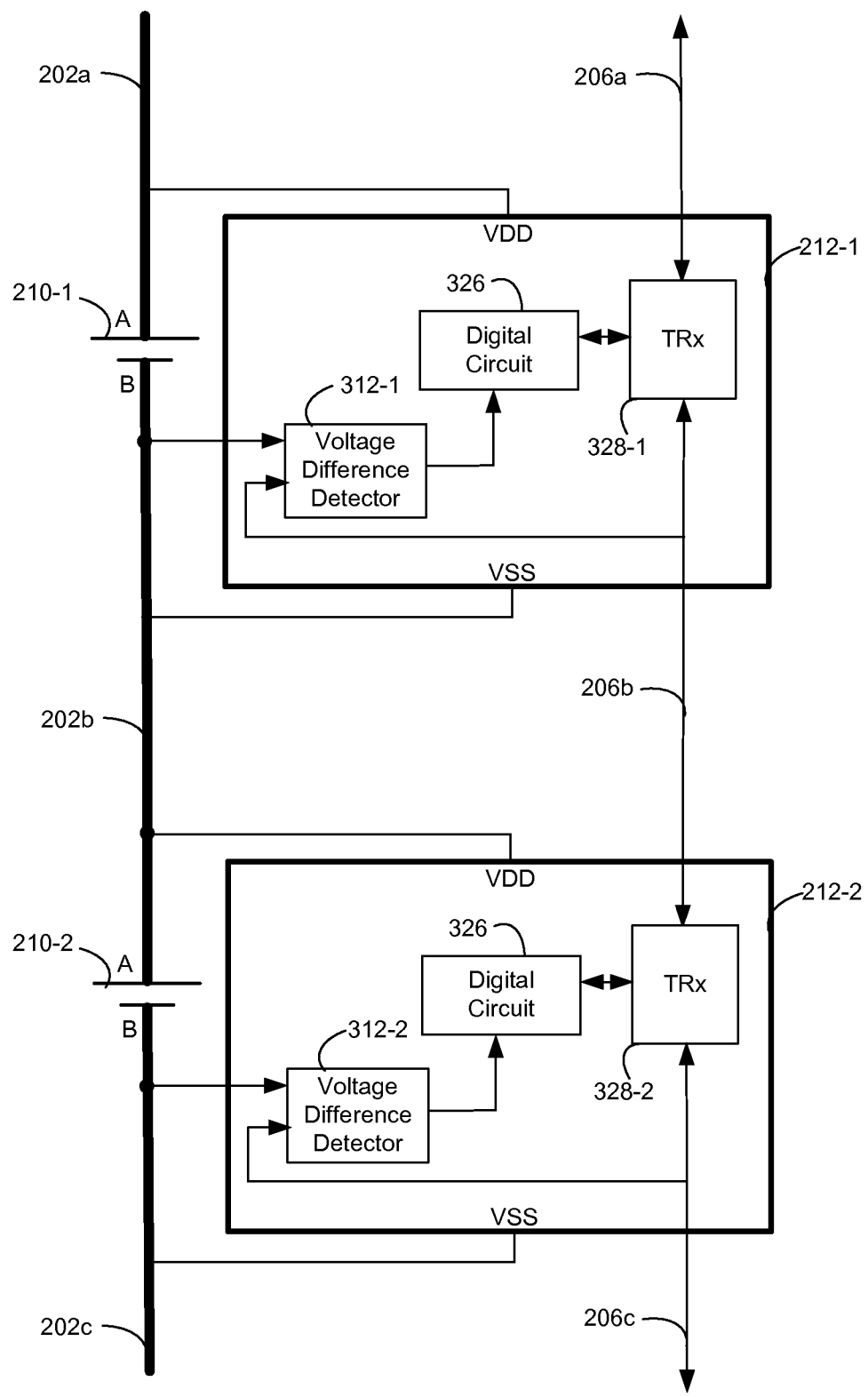
FIG. 4 is a block diagram of a battery pack with integrated supervisors, according to yet another embodiment of the invention.

FIG. 4 is a block diagram of a battery pack with integrated supervisors 212, according to another embodiment of this invention. FIG. 4 is similar to FIG. 3, except that the supervisor 212 is built external to the associated battery cell 210. Accordingly, the designations of nodes A and B represent the cell electrodes A and B as well as their contacts with the power bars 202. In this configuration, the battery cell 210 supplies voltages VDD and VSS for the associated supervisor 212 from the power bars 202 coupled to the positive electrode A and negative electrode B, respectively. Also, the voltage difference detector 312 may be coupled to power bar 202.

As above, when a degraded contact (e.g., node A or B of the battery cell 210-1) causes a potential decrease, the voltage difference detector 312-1 will detect a voltage difference change between the power bar 202b and the communication wire 206b, when the TRx 328-1 transmits on the communication wire 206b. The voltage difference between the power bar 202b and the communication wire 206b implicitly reflects the voltage across the battery cell 210-1. If the detected voltage difference is out of a predetermined threshold range (e.g., below a predetermined threshold), the voltage difference detector 312-1 may assert a signal to indicate degraded contact of the battery cell 210-1 with the power bar 202a or 202b. Each of the battery cells 210 may be detected similarly.

Alternatively, if the voltage difference detector 312 is coupled to the power bar 202 on the positive electrode A of the associated battery cell 210 and the corresponding communication wire 206, a degraded contact A (or B) of the battery cell 210-1 causes the potential on power bar 202*a* to decrease. The voltage difference detector 312-2 in the battery cell 210-2 will detect a voltage difference change between the power bar 202*b* and the communication wire 206*b*, when the TRx 328-2 receives on the communication wire 206*b*. If the detected voltage difference is out of a predetermined threshold range (e.g., below a predetermined threshold), the voltage difference detector 312-2 may assert a signal to indicate degraded contact of the battery cell 210-1 with the power bar 202*a* or 202*b*. Each of the battery cells 210 may be detected similarly.

Figure 5:
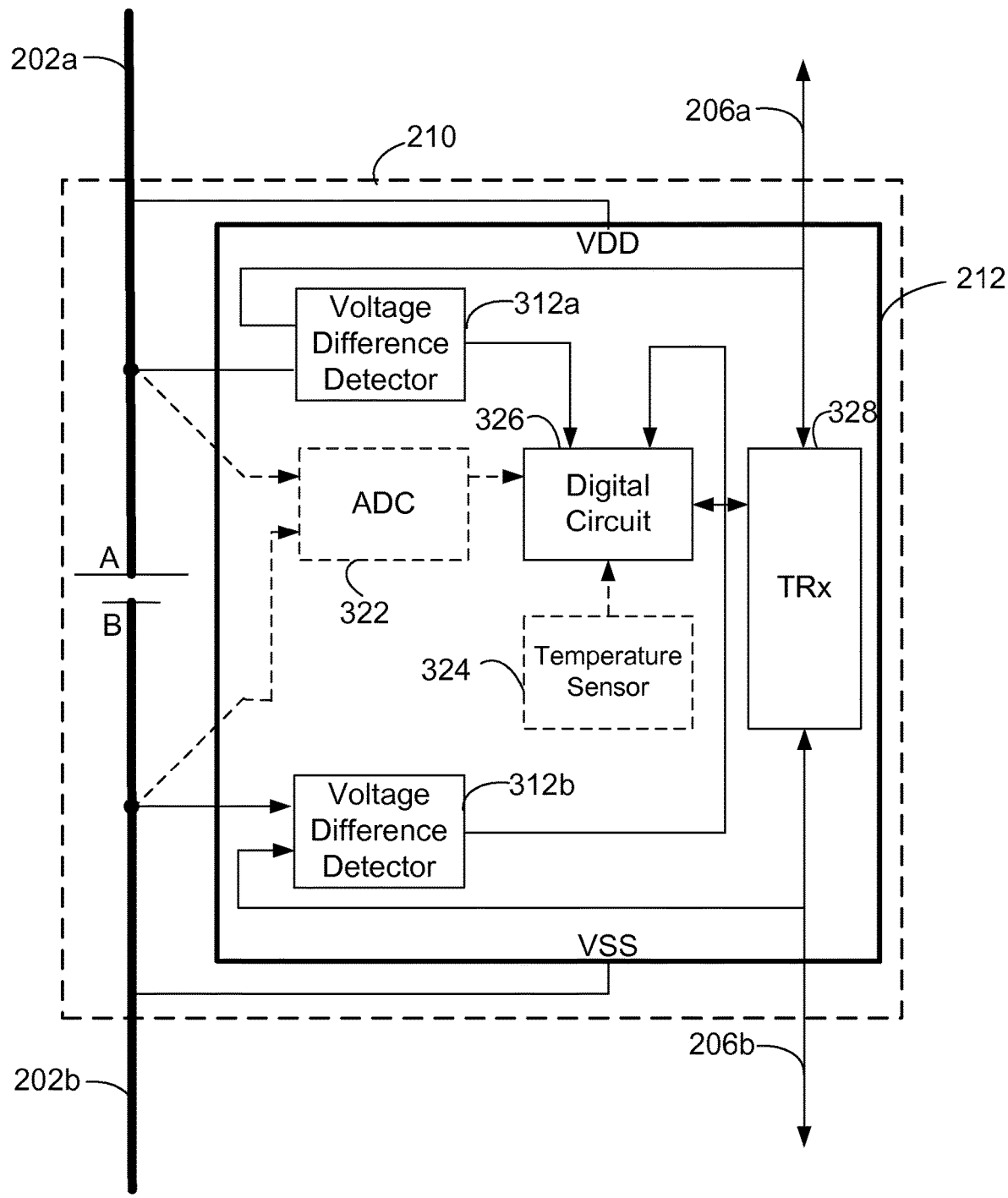
FIG. 5 is a block diagram of a battery cell with integrated supervisors, according to an embodiment of the invention.

FIG. 5 is a block diagram of a battery cell in a battery pack with integrated supervisors, according to a both-side supervision configuration in an embodiment of this invention. In particular, the supervisor 212 may include a voltage difference detector 312 on both electrode sides of the battery cell 210. For example, a voltage difference detector 312*a* is coupled to the power bar 202*a* and the corresponding communication wire 206*a*, and a voltage difference detector 312*b* is coupled to the power bar 202*b* and the corresponding communication wire 206*b*. The voltage difference detectors 312*a* and 312*b* operate similarly as the aforementioned voltage difference detectors 312 coupled to the positive and negative electrode sides, respectively. Although the supervisor 212 is shown as being integrated within the battery cell 210, the supervisor 212 may be built external to the battery cell 210, in a similar way as shown in FIG. 4. Having two voltage difference detectors in each supervisor can always monitor the power bar 202 and the corresponding communication wire 206, irrespective of the direction of signal communication on the communication wire 206, thereby providing redundancy to achieve a high automotive safety requirement (e.g. ASIL), which is desirable in automotive applications.

Optionally, the supervisor 212 may further include an ADC 322 for monitoring a voltage across the battery cell 210, a temperature sensor 324 for continuously monitoring the temperature within the battery cell 210, a pressure sensor (not shown), as well as other sensors for measuring other parameters of the battery cell 210. The digital circuit 326 may receive and analyze the various measurements to determine the state of health of the battery cell over time, and to control the operation of the battery cell 210 based on the measurements or commands from the pack controller 230.

In one embodiment, the voltage difference detector 312 described above may be implemented with a comparator, which is configured to compare the measured voltage difference (or the absolute value thereof) to a predetermined threshold value. Once the measured voltage difference exceeds the threshold value, the comparator may trip to signal the digital circuit 326 or the pack controller 230. The threshold range (or threshold value) may be programmable or configurable, to optimize the system for different applications or usage scenarios. Such threshold range (or threshold value) may be determined based on the normal range (or normal value) and an appropriate margin. By example and without limitation, suppose a normal contact has a typical resistance of 0.1 mOhm and the pack current has a peak value of 200 A, resulting a peak contact voltage of 20 mV which is in the "normal" range. An appropriate threshold value for the comparator might be set as 40 mV, which would allow a contact resistance that has been doubled. The margins depend on the specific application and the overall constraints imposed on the battery pack.

In another embodiment, the voltage difference detectors 312 as described above may be implemented with Schmitt triggers. The Schmitt trigger is a type of comparator with a built-in trip voltage and hysteresis. This way, the voltage difference between each power bar and its associated communication line can always be measured, irrespective of the direction of signal communication on the communication wire 206.

In an alternative embodiment, the voltage difference detector 312 may be implemented with an Analog-to-Digital Converter (ADC) to sense the voltage difference between the power bar 202 and communication wire 206. The ADC may convert the measured voltage difference to a digital value and send it to the digital circuit 326 for processing. In this situation, the digital circuit 326 may comprise a comparator or a software routine to determine whether the voltage difference is higher or lower than the threshold value. An advantage of digitizing is that the measured "contact" voltage can be divided by the pack current, so the contact resistance can be measured to a desired accuracy. In some applications, the ADC 322 may be time-multiplexed to alternately convert the cell voltage or the measured voltage difference. Accordingly, the voltage difference detector 312 can be eliminated.

The information detected by the voltage difference detector 312, among other measurements monitored by the supervisor 212, may be transmitted to the pack controller 230 through TRx 328 and the daisy chain of communication wires 206. As an option, either an OK/NOK signal indicating that the voltage across a power bar contact is below/above a threshold may be transmitted to the pack controller 230. Alternatively, the supervisor 212 may send the measured voltage difference to the pack controller 230, which then makes a determination as to whether the power bar contact is operating normally. In addition, the transmitted signal may include an identifier corresponding to the contact(s) being detected, such that the degraded contact(s) can be located accurately.

Any appropriate countermeasures may be taken if a degraded contact (e.g., due to corrosion, loose contact, etc.) is detected. For example, the pack controller 230 may warn the user (e.g., a car driver) that the battery pack should be checked or repaired. In addition or alternatively, the pack controller 230 may automatically cut off the battery pack upon detection of dramatic increase in the contact resistance either during charging or discharging, to protect the battery cells/pack from damage. Because the pack controller 230 can identify where the degraded contact is located, a user or technician can make correction very quickly and precisely. For example, a loose bolt may be fastened or a corroded connector may be replaced, before the battery degrades catastrophically.

The embodiments described above provide a variety of advantages. The degradation (such as corrosion or loosening) of a contact can be detected by the cell supervisor. By simply monitoring the voltage difference between the power bar and the corresponding communication line, an increase of the contact resistance can be detected for each individual power bar in the battery pack. All required additional circuitry can be easily integrated into the cell supervisor. Such detection is beneficial to improve the performance of the battery pack, extend the battery lifetime between recharges, and avoid potential damage to the battery pack. In addition, the contact detection can be combined with other measurements, such as voltage, temperature, pressure, etc., without the need to add external components or wiring.

Aspects of the present invention are believed to be applicable to a variety of different types of devices, systems and arrangements involving batteries and/or battery control, including those involving automotive applications. While the present invention is not necessarily so limited, various aspects of the invention may be appreciated through a discussion of examples using this context.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A battery pack comprising:
   at least a first battery cell and a second battery cell; and
   a power bar for coupling a first electrode of the first battery cell to a second electrode of the second battery cell, wherein the first battery cell comprises a supervisor, which comprises:
   a first transmitter/receiver;
   a communication wire connected between the first transmitter/receiver and a second transmitter/receiver in the second battery cell for signal communication with the second battery cell; and
   a voltage difference detector having a first input coupled to the power bar and a second input coupled to the communication wire between the first transmitter/receiver and the second transmitter/receiver, for detecting a voltage difference between the power bar and the communication wire,
   wherein the supervisor is configured to indicate degraded contact of the power bar if the detected voltage difference is out of a predetermined threshold range.

2. The battery pack of claim 1, wherein the supervisor further comprises a digital circuit coupled to the voltage difference detector for analyzing the detected voltage difference.

3. The battery pack of claim 1, wherein the voltage difference detector is configured to detect the voltage difference when the first transmitter/receiver is receiving signal communication via the communication wire.

4. The battery pack of claim 1, wherein the signal communication via the communication wire occurs in a current domain or voltage domain, and the voltage difference detector is configured to detect a DC voltage difference between the power bar and the communication wire.

5. The battery pack of claim 1, wherein the degraded contact comprises at least one of contact corrosion or loose-contact.

6. The battery pack of claim 1, further comprising:
   a pack controller for controlling operation of the battery pack, wherein the at least the first battery cell and the second battery cell communicate with the pack controller through a daisy chain of communication wires.

7. The battery pack of claim 1, wherein the voltage difference detector comprises at least one of a comparator or an Analog-to-Digital Converter (ADC).

8. The battery pack of claim 1, wherein the voltage difference detector comprises an Analog-to-Digital Converter (ADC) which is configured to alternately detect a voltage across two electrodes of the first battery cell or the voltage difference between the power bar and the communication wire.

9. The battery pack of claim 1, wherein the voltage difference detector comprises a Schmitt trigger.

10. The battery pack of claim 1, wherein:
    the supervisor is integrated within the first battery cell, wherein the voltage difference detector is coupled to the first electrode of the first battery cell; or
    the supervisor is external to the first battery cell, wherein the voltage difference detector is coupled to the power bar.

11. The battery pack of claim 1, wherein the supervisor further comprises a voltage difference detector coupled to another electrode of the first battery cell.

12. A battery cell, comprising:
    a power bar coupled to an electrode of the battery cell for power transmission; and
    a supervisor, wherein the supervisor comprises:
    a first transmitter/receiver;
    a communication wire for connecting between the first transmitter/receiver and a second transmitter/receiver in an adjacent battery cell for signal communication between the battery cell and the adjacent battery cell; and
    a voltage difference detector having a first input coupled to the power ball and a second input coupled to the communication wire between the first transmitter/receiver and the second transmitter/receiver, for detecting a voltage difference between the power bar and the communication wire,
    wherein the supervisor is configured to indicate degraded contact of the power bar if the detected voltage difference is out of a predetermined threshold range.

13. The battery cell of claim 12, wherein the voltage difference detector is configured to detect the voltage difference when the first transmitter/receiver is receiving signal communication via the communication wire.

14. The battery cell of claim 12, wherein the degraded contact comprises at least one of contact corrosion or loose-contact.

15. The battery cell of claim 12, wherein the voltage difference detector comprises at least one of a comparator, an Analog-to-Digital Converter (ADC), or a Schmitt trigger.

16. The battery cell of claim 12, wherein the supervisor is integrated within the battery cell or is external to the battery cell.

17. The battery pack of claim 1, further comprising:
    a pack controller for controlling operation of the battery pack, wherein the at least first battery cell and the second battery cell communicate with the pack controller through a daisy chain of communication wires;
    wherein the supervisor is integrated within the first battery cell, wherein the voltage difference detector is coupled to the first electrode of the first battery cell;
    wherein the supervisor further comprises a voltage difference detector coupled to another electrode of the first battery cell.

18. The battery pack of claim 17, further comprising:
    a second supervisor integrated into the second battery cell.

19. The battery pack claim 1, wherein the supervisor further comprises:
a digital circuit;
wherein the digital circuit is configured to compare the detected voltage difference to the predetermined threshold range to ascertain whether the contact is degraded.

* * * * *